(12) United States Patent
Isaji et al.

(10) Patent No.: US 11,955,786 B2
(45) Date of Patent: Apr. 9, 2024

(54) ELECTRICAL JUNCTION BOX

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yusuke Isaji, Mie (JP); Kenji Nakagawa, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 420 days.

(21) Appl. No.: 17/606,899

(22) PCT Filed: Apr. 27, 2020

(86) PCT No.: PCT/JP2020/017954
§ 371 (c)(1),
(2) Date: Oct. 27, 2021

(87) PCT Pub. No.: WO2020/230611
PCT Pub. Date: Nov. 19, 2020

(65) Prior Publication Data
US 2022/0209518 A1  Jun. 30, 2022

(30) Foreign Application Priority Data
May 10, 2019  (JP) .................. 2019-089480

(51) Int. Cl.
*H02G 3/08*  (2006.01)
*H01R 4/30*  (2006.01)
(Continued)

(52) U.S. Cl.
CPC ............. *H02G 3/088* (2013.01); *H01R 9/223* (2013.01); *H01R 9/24* (2013.01); *H02G 3/14* (2013.01); *H01R 4/308* (2013.01)

(58) Field of Classification Search
CPC .......... H02G 3/088; H02G 3/14; H01R 9/223; H01R 9/24; H01R 4/308; H01R 9/18;
(Continued)

(56) References Cited

U.S. PATENT DOCUMENTS 5,023,752 A * 6/1991 Detter ................ B60R 16/0238
                                                           361/752
9,431,806 B2   8/2016 Ueyama
(Continued)

FOREIGN PATENT DOCUMENTS

JP   2002-186133   6/2002
JP   2010-211933   9/2010
(Continued)

OTHER PUBLICATIONS

International Search Report issued in International Bureau of WIPO Patent Application No. PCT/JP2020/017954, dated Jul. 28, 2020, along with an English translation thereof.

*Primary Examiner* — Edwin A. Leon
(74) *Attorney, Agent, or Firm* — Greenblum & Bernstein, P.L.C.

(57) ABSTRACT

Provided is an electrical junction box that has a novel structure capable of stably preventing water from intruding into a case while simplifying the operation for connecting the electrical junction box and an external apparatus. An electrical junction box includes a circuit structure that includes a connection terminal for connection to an external apparatus, a case that has an insertion hole and houses the circuit structure, a relay terminal that is connected to the connection terminal, and includes an external connection portion that is inserted into the insertion hole and is exposed (Continued)

to the outside of the case, and a sealing member that is compressed between opposing surfaces of the insertion hole and the relay terminal and seals the insertion hole.

4 Claims, 3 Drawing Sheets

(51) Int. Cl.
    *H01R 9/22*     (2006.01)
    *H01R 9/24*     (2006.01)
    *H02G 3/14*     (2006.01)

(58) Field of Classification Search
CPC . H01R 4/34; H01R 11/12; H05K 5/06; H05K 5/0004; B60R 16/0238
See application file for complete search history.

(56) References Cited

U.S. PATENT DOCUMENTS

| | | | | |
|---|---|---|---|---|
| 2004/0048142 | A1* | 3/2004 | Marusak | B60R 16/0238 429/61 |
| 2019/0123495 | A1* | 4/2019 | Darr | H01R 27/02 |
| 2019/0123522 | A1* | 4/2019 | Darr | H02B 1/20 |

FOREIGN PATENT DOCUMENTS

| | | |
|---|---|---|
| JP | 2011-146230 | 7/2011 |
| JP | 2014-027723 | 2/2014 |

* cited by examiner

ELECTRICAL JUNCTION BOX

TECHNICAL FIELD

The present disclosure relates to an electrical junction box that has a waterproof function.

BACKGROUND ART

Electrical junction boxes that are mounted in automobiles, and have a waterproof function for preventing water intrusion thereinto are widely used. Patent Document 1, for example, discloses an electrical junction box that includes a case main body that houses a circuit structure constituted by a plurality of electrical components and a lid body that covers the opening of the case main body, and the peripheral wall of the case main body has a specific double-walled structure. With this double-walled structure, water is discharged to the outside of the case and is prevented from intruding into the case.

Patent Document 2 discloses a structure for preventing water from intruding into a case by following a wire harness extending from an external apparatus, at a site where a partner terminal crimped to the wire harness is connected to a connection terminal provided in a circuit structure housed in the case. Specifically, water is prevented from intruding into the case through a wire harness insertion hole by installing a rubber grommet in the harness insertion hole provided in the case, and engaging a corrugated tube that is externally mounted to the wire harness with the grommet.

CITATION LIST

Patent Documents

Patent Document 1: JP 2014-27723A
Patent Document 2: JP 2002-186133A

SUMMARY OF INVENTION

Technical Problem

With the structures of Patent Documents 1 and 2, it is necessary to first perform, when the case is open, an operation for connecting a current-carrying member for connection to the external apparatus to a connection terminal of the circuit structure housed in the case, and then cover the opening of the case with the lid body to ensure sealability. Furthermore, it is also necessary to perform an operation for installing a waterproof member such as a grommet in the insertion hole for exposing the current-carrying member to the outside of the case. Therefore, the operation of connecting the electrical junction box and the external apparatus involves a lot of steps, and the operation is complicated. In addition, there has also been a risk that the sealability of the electrical junction box realized by the lid body, the grommet, or the like will differ depending on the worker.

In view of this, the present disclosure aims to provide an electrical junction box that has a novel structure capable of stably preventing water from intruding into a case while simplifying the operation of connecting an electrical junction box and an external apparatus.

Solution to Problem

An electrical junction box according to the present disclosure includes: a circuit structure that includes a connection terminal for connection to an external apparatus; a case that includes an insertion hole, and houses the circuit structure; a relay terminal whose one end portion is connected to the connection terminal, and other end portion is inserted into the insertion hole, is exposed to the outside of the case, and forms an external connection portion; and a sealing member that is compressed between opposing surfaces of the insertion hole and the relay terminal, and seals the insertion hole, wherein a circumferential wall portion of the insertion hole includes an annular groove that is open upward in an inner circumferential surface of the insertion hole, and houses the sealing member, the pair of relay terminals are respectively connected to the pair of connection terminals while the external connection portions of the pair of relay terminals are respectively inserted into the pair of insertion holes provided in the case, and are exposed to the outside of the case, the case includes a cover member that includes a pair of annular portions that are attached to the circumferential wall portions of the pair of insertion holes and cover upper portions of the annular grooves while the external connection portions are respectively inserted into the annular portions and are exposed to the outside of the case, and the cover member includes an insulative wall protruding between the pair of external connection portions, and surrounds circumferences of the external connection portions, the insulative wall coupling the pair of annular portions.

Advantageous Effects of Invention

According to the present disclosure, it is possible to stably prevent water from intruding into a case while simplifying the operation of connecting an electrical junction box and an external apparatus.

EMBODIMENTS OF INVENTION

Description of Embodiments of Present Disclosure

First, embodiments of the present disclosure will be listed and described.

An electrical junction box according to the present disclosure includes:
(1) a circuit structure that includes a connection terminal for connection to an external apparatus; a case that includes an insertion hole, and houses the circuit structure; a relay terminal that is connected to the connection terminal, and includes an external connection portion that is inserted into the insertion hole and is exposed to the outside of the case; and a sealing member that is compressed between opposing surfaces of the insertion hole and the relay terminal, and seals the insertion hole, wherein a circumferential wall portion of the insertion hole includes an annular groove that is open upward in an inner circumferential surface of the insertion hole, and houses the sealing member, the pair of relay terminals are respectively connected to the pair of connection terminals while the external connection portions of the pair of relay terminals are respectively inserted into the pair of insertion holes provided in the case, and are exposed to the outside of the case, the case includes a cover member that includes a pair of annular portions that are attached to the circumferential wall portions of the pair of insertion holes and cover upper portions of the annular grooves while the external connection portions are respectively inserted into the annular portions and are exposed to the outside of the case, and the cover member includes an insulative wall protruding between the pair of external connection portions, and surrounds circumferences of the external connection portions, the insulative wall coupling the pair of annular portions.

With the electrical junction box according to the present disclosure, a portion of the relay terminal that is connected to the connection terminal of the circuit structure housed in the case is exposed to the outside of the case, and forms the external connection portion. Therefore, the operation for connecting the electrical junction box to the external apparatus is completed by simply performing an operation for connecting a current-carrying member of the external apparatus to the external connection portion exposed to the outside of the case of the electrical junction box. Therefore, an operation for covering the opening of the case with the lid body to ensuring sealability, and an operation for installing a waterproof member in the insertion hole for exposing the current-carrying member to the outside of the case, which have conventionally been required, are no longer necessary, and it is possible to simplify the operation for connecting the electrical junction box and the external apparatus.

The sealing member is compressed between the opposing surfaces of the relay terminal and the insertion hole, and the sealability of the insertion hole is ensured. Furthermore, regarding the operation for connecting the electrical junction box and the external apparatus, the worker does not need to open the case, or perform some form of operation on the sealing member, and thus there is no risk that the sealability will differ depending on a worker, and it is possible to stably prevent water from intruding into the case. In addition, the sealing member can be easily positioned using the annular groove. When the sealing member is compressed between the opposing surfaces of the relay terminal and the insertion hole, the sealing member is also compressed against a bottom wall of the annular groove that is open in the inner surface of the insertion hole. Accordingly, it is possible to ensure improved waterproof properties of the electrical junction box. In addition, the cover member that is provided separately from the case makes it easy to provide, to the case, the insulative wall between the pair of external connection portions and the wall portion that surrounds the circumferences of the external connection portions. Accordingly, it is also possible to easily realize insulation between the external connection portions, prevention of unnecessary contact between another member and the external connection portions, and the like.

(2) It is preferable that the relay terminal has a cylindrical shape, and is inserted into the circular insertion hole, and the insertion hole is sealed as a result of the sealing member having a ring-like shape mounted on an outer circumferential surface of the relay terminal being tightly attached to an inner circumferential surface of the insertion hole and the outer circumferential surface of the relay terminal. The sealing member that has a ring-like shape and is elastically deformable is compressed between the opposing surfaces of the circular insertion hole and the relay terminal that has a cylindrical shape and is inserted into the insertion hole, and thus the compressed state of the sealing member can be made uniform over the entire circumference thereof. As a result, the sealing member can be tightly attached to the inner circumferential surface of the insertion hole and the outer circumferential surface of the relay terminal in a stable manner, and the sealability can be advantageously improved.

(3) In the above (2), it is preferable that one end surface in an axial direction of the cylindrical relay terminal is exposed to the outside of the case, a screw hole for fastening a bolt is formed open at the center of the one end surface in the axial direction, a placement surface for a partner terminal is formed around the screw hole, and the one end surface in the axial direction forms the external connection portion. The screw hole for fastening a bolt and the placement surface of the partner terminal can be provided using the end surface in the axial direction of the cylindrical relay terminal, with high space efficiency. Moreover, it is possible to support a high-voltage connection structure by fastening the partner terminal to the relay terminal using a bolt, and the structure according to the present disclosure can be advantageously applied to a high-voltage electrical junction box.

(6) It is preferable that the case includes a box-like case main body that has an opening portion, and a lid body that covers the opening portion of the case main body in a tightly closed state, and the insertion hole is provided in the lid body. Accordingly, it is possible to easily attach the circuit structure through the opening portion of the case main body. Moreover, since the insertion hole is provided in the lid body that covers the opening portion in a tightly closed state, the external connection portion can be exposed to the outside of the case while maintaining the waterproof properties of the case.

Detailed Embodiments of Present Disclosure

Specific examples of an electrical junction box according to the present disclosure will be described below with reference to the drawings. Note that the present disclosure is not limited to illustrations of these, but is indicated by the claims, and all changes that come within the meaning and range of equivalency of the claims are intended to be embraced therein.

First Embodiment

A first embodiment of the present disclosure will be described below with reference to FIGS. 1 to 4. An electrical junction box 10 is mounted in a vehicle such as an electric automobile or a hybrid automobile (not illustrated), and functions as a safety apparatus. A battery is used as a vehicle running battery for supplying power to a motor for running the vehicle, for example, and the electrical junction box 10 is used to connect this vehicle running battery to a vehicle-side load via a circuit structure 12 shown in FIG. 1. The electrical junction box 10 can be disposed in any orientation, but the following description will be given assuming that the Z direction is defined as an upward direction, the Y direction is defined as a forward direction, and the X direction is defined as a rightward direction. In addition, only some of a plurality of the same members are given reference numerals, and reference numerals may be omitted for the other members.

Circuit Structure 12

Figure 1:
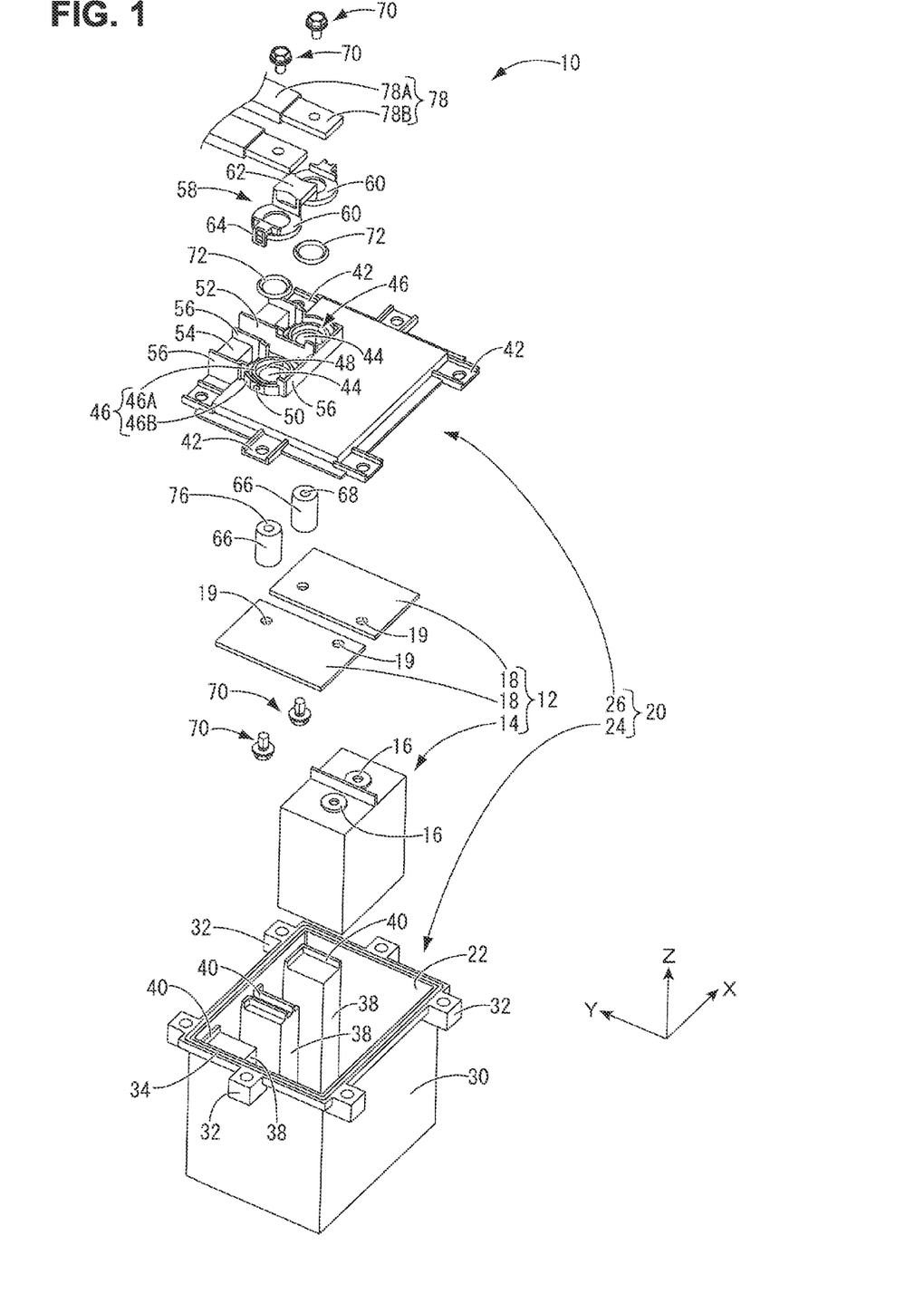
FIG. 1 is an exploded perspective view showing an electrical junction box according to a first embodiment of the present disclosure.

As shown in FIG. 1, for example, the circuit structure 12 includes a relay unit 14 that includes a precharge circuit, and connection terminals 18 that are electrically connected to a pair of input/output electrodes 16 of this relay unit 14 respectively. The output side of a battery, which is an external apparatus (not illustrated) for supplying power to the motor for running the vehicle, is electrically connected to one of the connection terminals 18 of the circuit structure 12. A vehicle-side load, which is an external apparatus (not illustrated), is electrically connected to the other connection terminal 18 of the circuit structure 12.

Each connection terminal 18 is formed by pressing a metal plate into a substantially rectangular shape. A metal that has low electrical resistance such as copper, a copper alloy, aluminum, or an aluminum alloy can be appropriately selected as the metal that forms the connection terminal 18. The connection terminals 18 are respectively screwed to the pair of input/output electrodes 16 of the relay unit 14 via through holes 19 formed on the rear end sides thereof. As a result, the rear end sides of the connection terminals 18 are disposed on the upper surface of the relay unit 14, and front end sides of the connection terminals 18 extend forward from the upper surface of the relay unit 14.

Relay Unit 14

A main relay (not illustrated) for electrically connecting the output side of the battery to the vehicle-side load is housed in the relay unit 14. In addition, a precharge circuit, in which a precharge relay and a precharge resistor (which are not illustrated) are connected in series such that they bypass this main relay, is connected to the main relay. The vehicle-side load includes a large capacity capacitor whose electrostatic capacitance is 200 to 5000 μF, for example, and when the main relay is switched ON in a state where the capacitor is fully discharged, a very large charge current instantaneously flows in order to charge the capacitor. Such a very large charge current can cause damage to a connection portion of the main relay, and thus the precharge circuit is provided in order to prevent any harmful effect caused by a charge current. Note that both the main relay and the precharge relay are relays that switch a connection portion ON or OFF by moving a movable connection portion when an exciting coil is in a conducting state, and ON/OFF control thereof is performed by a control circuit (not illustrated).

Electrical Junction Box 10

As shown in FIG. 1, for example, the electrical junction box 10 includes the circuit structure 12, relay terminals 66 that are electrically connected to the connection terminals 18 of the circuit structure 12, a case 20 that houses the circuit structure 12, and sealing members 72 that seal insertion holes 44 for exposing the relay terminals 66 to the outside of the case 20.

Case 20

The case 20 includes a box-like case main body 24 that has an upper opening portion 22 and a lid body 26 that covers the upper opening portion 22 in a tightly closed state. The case main body 24 and the lid body 26 are separate bodies, and are formed by injection molding an insulative synthetic resin into a predetermined shape. The synthetic resin that forms the case main body 24 and the lid body 26 may contain a filler such as glass fiber.

Case Main Body 24

Figure 4:
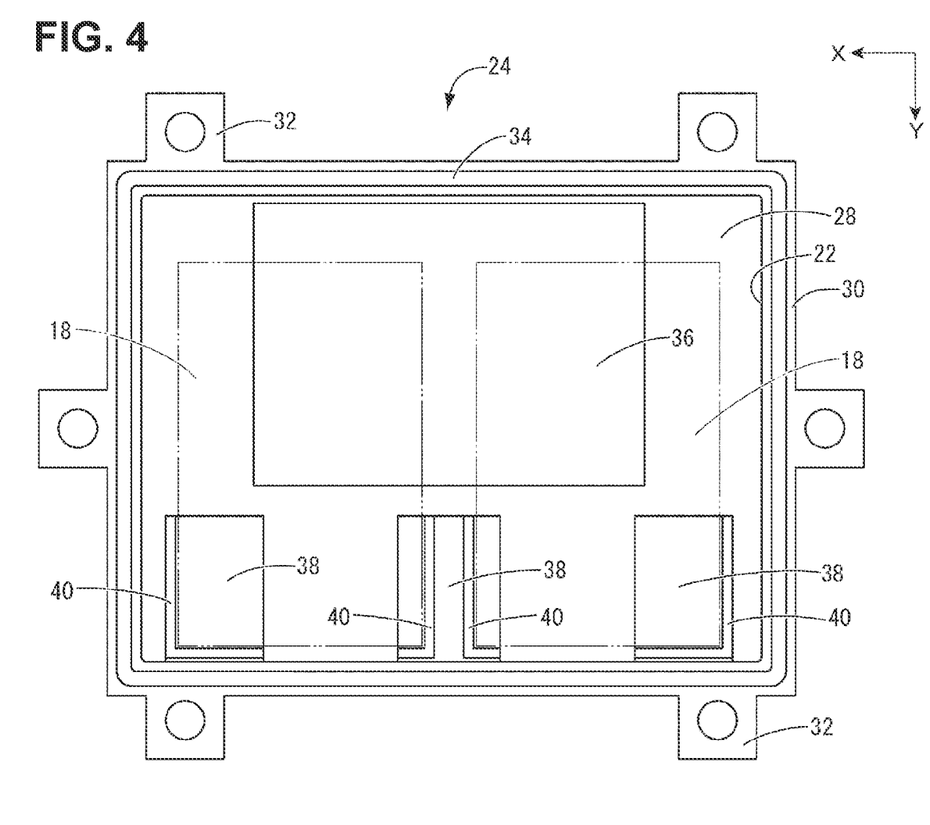
FIG. 4 is an enlarged plan view of the case main body shown in FIG. 1.

As shown in FIGS. 1 and 4, for example, the case main body 24 has an overall substantially rectangular box-like shape that is open upward, and includes a bottom wall 28 and a peripheral wall 30 that protrudes upward from an edge portion of the bottom wall 28. In the first embodiment of the present disclosure, the external shape of the case 20 is substantially rectangular as viewed from above. Note that the external shape of the case 20 is not limited to the shape in this embodiment.

Figure 2:
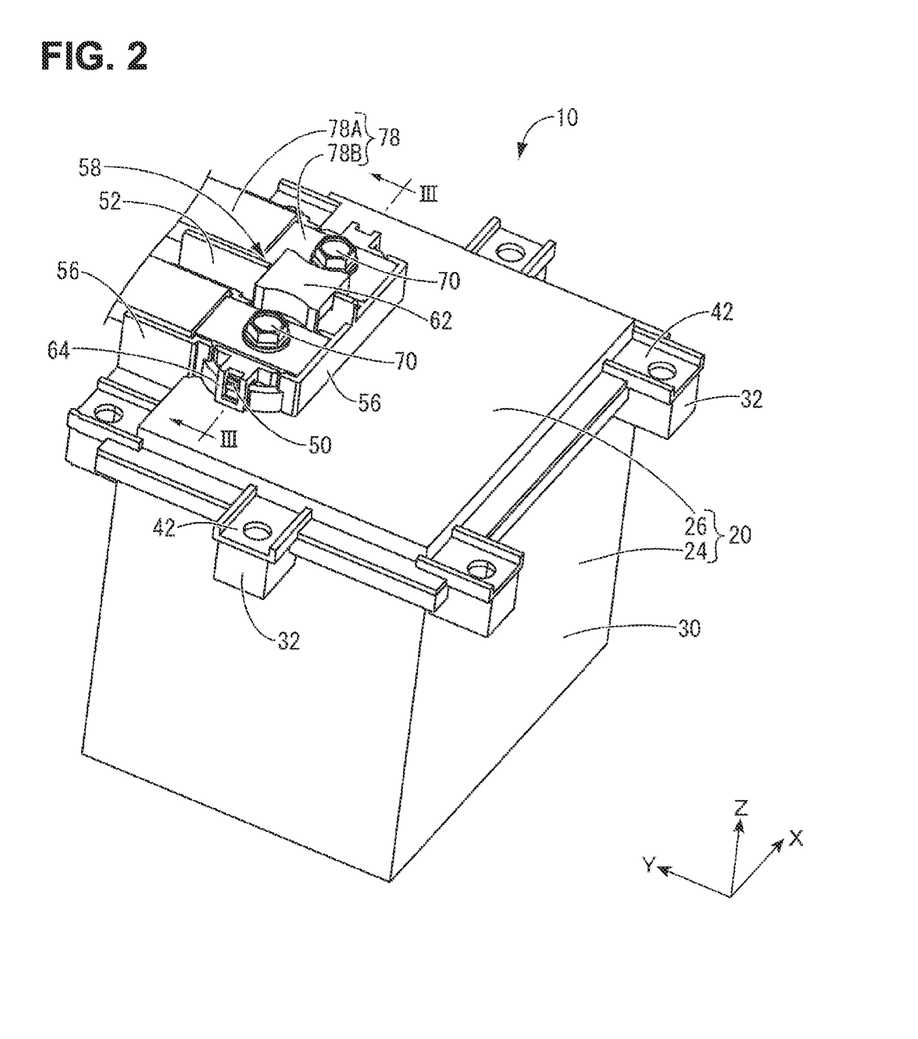
FIG. 2 is an enlarged perspective view of an attachment state of the electrical junction box shown in FIG. 1.

As shown in FIGS. 1, 2, and 4, substantially rectangular block-like fixing portions 32 protrude outward from six locations along the circumferential direction of the upper end portion of the peripheral wall 30 of the case main body 24. In addition, a groove that is open upward is formed over the entire circumference of the peripheral wall 30, in the upper surface of the peripheral wall 30 of the case main body 24, and a frame-like waterproof member 34 is attached to this groove.

As shown in FIG. 4, a relay unit mount 36 that protrudes upward in a substantially rectangular shape is provided on the rear side of the bottom wall 28 of the case main body 24. As shown in FIGS. 1 and 4, three connection terminal supporting portions 38, which have a square pillar shape, that protrude from the bottom wall 28 by a height that is slightly smaller than the height of the upper opening portion 22, are coupled to the peripheral wall 30, and are spaced apart from each other in the longitudinal direction, are provided on the front side of the bottom wall 28 of the case main body 24. One or two L-shaped elongated protrusions 40 protrude from the upper surface of each of these connection terminal supporting portions 38, and the corner portions on the front end side of the connection terminals 18 extending forward from the upper surface of the relay unit 14 are housed and held on the inner side of the elongated protrusions 40. Note that all of the fixing portions 32 are formed in one piece with the case main body 24.

Lid Body 26

As shown in FIGS. 1 and 2, for example, the lid body 26 has a substantially rectangular flat plate shape. On the outer peripheral edge portion of the lid body 26, substantially gutter-shaped fixing portions 42 protrude outward, at six locations corresponding to the fixing portions 32 of the case main body 24. On the front side of the lid body 26, a pair of insertion holes 44 that have a circular cross section and are provided extending through the lid body 26 in the thickness direction thereof are provided spaced apart from each other. Cylindrical double walls 46 protrude upward from the circumferential edge portions of the insertion holes 44. The internal diameter of the lower end portion of an inner wall 46A of each double wall 46 is the same as that of the insertion hole 44, and the internal diameter of the upper end portion the inner wall 44a is larger than that of the insertion hole 44. Accordingly, a step is formed between the lower end portion and the upper end portion, and, due to this step, an annular groove 48 that is open in the inner circumferential surface of the insertion hole 44 is provided. As will be described later, a ring-like sealing member 72 is housed in this annular groove 48.

Figure 3:
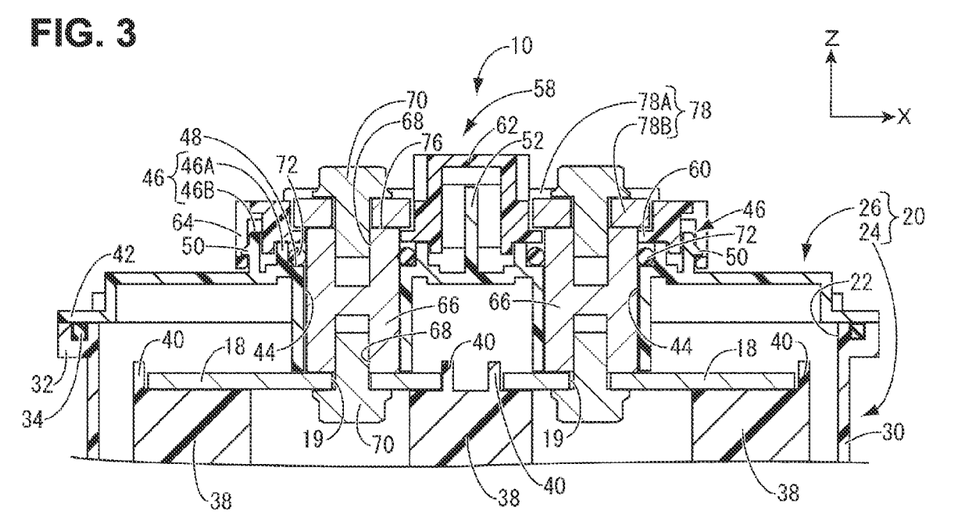
FIG. 3 is an enlarged cross-sectional view taken along the line III-III in FIG. 2.

As shown in FIGS. 1 and 3, an engaging protrusion 50 protrudes from each outer wall 46B of the double walls 46, the engaging protrusions 50 respectively producing from the outer circumferential surface on the right side of the outer wall 46B of the insertion hole 44 provided on the right side and the outer circumferential surface on the left side of the outer wall 46B of the insertion hole 44 provided on the left side. In addition, an insulative wall portion 52 that has a substantially rectangular plate shape protrudes between the pair of insertion holes 44. Furthermore, partner terminal supporting portions 54 that are open upward and extend outward are provided on the outer peripheral edge portion of the lid body 26 that is adjacent to the pair of insertion holes 44. Guide walls 56 protrude from the two sides of each partner terminal supporting portion 54 and from the rear side of the double walls 46.

A cover member 58 is attached to the double walls 46 provided for the pair of insertion holes 44, from above. The cover member 58 has a configuration in which a pair of annular portions 60 that cover the upper side of the outer walls 46B of the double walls 46 are coupled by a gate-like insulative wall 62. Engagement frame bodies 64 protrude downward from the two end portions in the longitudinal direction of the cover member 58.

Relay Terminal 66

As shown in FIG. 1, for example, each relay terminal 66 is made of metal and has a cylindrical shape, and the external diameter of the relay terminal 66 is slightly smaller than the diameter of the insertion hole 44. The relay terminal 66 is formed through cutting work or the like. A metal that has low electrical resistance such as copper, a copper alloy, aluminum, or an aluminum alloy can be appropriately selected as a metal that forms the relay terminal 66. The relay terminal 66 is formed to have screw holes 68 for fastening a bolt, the screw holes 68 being open at the center of the two end surfaces in the axial direction of the relay terminal 66. In this embodiment, the screw holes 68 formed in the two end surfaces in the axial direction of the relay terminal 66 are not in communication with each other, but may be in communication with each other.

Attachment Process of Electrical Junction Box 10

Next, an example of an attachment process of the electrical junction box 10 will be described. Note that the attachment process of the electrical junction box 10 is not limited to the following description.

First, the relay unit 14 is prepared. Next, the pair of relay terminals 66 are fixed to the through holes 19 formed on the front side of the pair of connection terminals 18, using screws 70. Accordingly, the pair of relay terminals 66 are respectively connected to the pair of connection terminals 18. By screwing this pair of connection terminals 18 to the pair of input/output electrodes 16 of the relay unit 14 via the through holes 19 formed on the rear side, the circuit structure 12 in which the relay terminals 66 are connected to the relay unit 14 to allow a current to flow is complete.

The circuit structure 12 in which the relay terminals 66 are connected is housed in the case main body 24. Accordingly, the relay unit 14 is placed on the relay unit mount 36, and the corner portions on the front end side of the connection terminals 18 extending forward from the upper surface of the relay unit 14 are housed on the inside of the elongated protrusions 40 protruding from the connection terminal supporting portions 38. In this state, the head portions of the screws 70 for screwing the pair of relay terminals 66 to the pair of connection terminals 18 are housed using the spaces between the connection terminal supporting portions 38 with high space efficiency, thus saving space. In addition, the pair of connection terminals 18 extend outward from the relay unit 14, and are provided and sized to reach the connection terminal supporting portions 38 that are spaced apart from the relay unit 14 and are provided on the peripheral wall 30 of the case main body 24. Furthermore, the pair of connection terminals 18 extend in an area that substantially covers the upper opening portion 22 of the case main body 24.

Next, the lid body 26 is prepared. Specifically, the sealing members 72 are inserted into the annular grooves 48 provided on the inner walls 46A of the double walls 46 that protrude from the peripheral edge portions of the pair of insertion holes 44 of the lid body 26. Next, the cover member 58 is attached to the double walls 46 provided to the pair of insertion holes 44, from above. Accordingly, the upper side of the annular grooves 48 that house the sealing members 72 is covered by the cover member 58, and the sealing members 72 are prevented from coming loose from the annular grooves 48.

The upper opening portion 22 of the case main body 24 is covered using the lid body 26 configured in this manner, and the fixing portions 42 of the lid body 26 are fastened to the fixing portions 32 provided at the upper end portion of the peripheral wall 30 of the case main body 24. As a result, the waterproof member 34 disposed in the groove formed in the upper surface of the peripheral wall 30 of the case main body 24 is pressed between the case main body 24 and the lid body 26, and thus the upper opening portion 22 of the case main body 24 is covered by the lid body 26 in a tightly closed state.

As shown in FIG. 3, in this state, the upper end surfaces in the axial direction of the relay terminals 66 that have a cylindrical shape are inserted into the insertion holes 44 of the lid body 26 that constitutes the case 20, and are exposed to the outside from the annular portions 60 that constitute the cover member 58. At the centers of these end surfaces in the axial direction, the screw holes 68 for fastening bolts are formed to be open upward, and placement surfaces on which partner terminals 78 to be described later are to be placed are formed around the screw holes 68. That is to say, these end surfaces in the axial direction form external connection portions 76. In addition, as shown in FIG. 3, the insulative wall 62 of the cover member 58 protrudes between the pair of external connection portions 76, and the cover member 58 surrounds the circumferences of the external connection portions 76.

Moreover, as shown in FIGS. 1 and 3, the ring-like sealing members 72 are mounted on the outer circumferential surfaces of the relay terminals 66 that have a cylindrical shape and are inserted into the circular insertion holes 44. As a result of these sealing members 72 being tightly attached to the inner circumferential surfaces of the insertion holes 44 and the outer circumferential surfaces of the relay terminals 66 and compressed therebetween, the insertion holes 44 are sealed. The electrical junction box 10 is formed in this manner.

Lastly, insulative coating portions 78A of the partner terminals 78 in which tab-like terminals are exposed are respectively placed on the partner terminal supporting portions 54, and tab-like connection portions 78B of the partner terminals 78 are placed on one end surfaces (the external connection portions 76) in the axial direction of the relay terminals 66 that are exposed to the outside from the insertion holes 44 of the lid body 26, and are fixed using the screws 70. Accordingly, the electrical junction box 10 and the external apparatus are electrically connected. Note that recesses formed on each annular portion 60 side of the insulative wall 62 that constitutes the cover member 58 are provided in order to prevent a tool for turning a screw 70 from coming into contact with the insulative wall 62.

Next, operative effects of the present embodiment will be described. According to this embodiment, the circuit structure 12 in which the relay terminals 66 are connected is housed in the case 20, and the external connection portions 76 formed by the one end surfaces in the axial direction of these relay terminals 66 are exposed to the outside of the case 20. As a result, by simply placing the partner terminals 78 on the one end surfaces (the external connection portions 76) in the axial direction of the relay terminals 66, and fixing them using the screws 70, work for connecting the electrical junction box 10 and external apparatus is completed. Therefore, the operation for covering the opening of the case with the lid body after connection and ensuring sealability, which has conventionally been required, and the operation for mounting waterproof members to insertion holes for exposing current-carrying members to the outside of the case are no longer necessary, and it is possible to simplify the operation for connecting the electrical junction box 10 and the external apparatus.

In addition, each sealing member 72 is tightly attached to the inner circumferential surface of the insertion hole 44 and the outer circumferential surface of the relay terminal 66, and is compressed therebetween, and thus the sealability of the insertion hole 44 is also ensured. Furthermore, when performing the operation for connecting the electrical junction box 10 and the external apparatus, the worker does not need to open the case or perform some form of operation on a sealing member. Accordingly, there is no risk of the sealability varying depending on the worker, and thus it is possible to stably prevent water from introducing into the case 20. In addition, each ring-like sealing member 72 is tightly attached to the inner circumferential surface of the insertion hole 44 and the outer circumferential surface of the relay terminal 66 and is compressed therebetween, and, as a result, the insertion hole 44 is sealed. Accordingly, the compressed state of the sealing member 72 can be made uniform over the entire circumference thereof, and thus it is possible to tightly attach the sealing member 72 in a stable state, and the sealability can be improved advantageously. Moreover, since the sealing member 72 is housed in the annular groove 48, the sealing member 72 can be easily positioned. In addition, when the sealing member 72 is compressed between the opposing surfaces of the relay terminal 66 and the insertion hole 44, it is also compressed against the bottom wall of the annular groove 48, and thus it is possible to ensure improved waterproof properties of the electrical junction box 10.

According to this embodiment, the one end surface in the axial direction of each relay terminal 66 that is exposed to the outside from the insertion hole 44 of the lid body 26 that constitutes the case 20 is used as the external connection portion 76 for connection to the partner terminal 78. Specifically, the screw hole 68 for fastening a bolt is open at the center of the one end surface (the external connection portion 76), and a placement surface for the partner terminal 78 is formed around the screw hole 68. Accordingly, it is possible to provide the screw hole 68 for fastening a bolt and the placement surface for the partner terminal 78 with high space efficiency. Moreover, the operation for connecting the electrical junction box 10 and the external apparatus is completed simply by placing the partner terminals 78 on the one end surfaces (the external connection portions 76) in the axial direction of the relay terminals 66, and fixing them using the screws 70, and thus a high-voltage connection structure can be supported, and the structure according to the present disclosure can be advantageously applied to a high-voltage electrical junction box.

In addition, the case main body 24 and the lid body 26 are separate bodies, and thus the circuit structure 12 and the relay terminals 66 can be easily housed from the upper opening portion 22 of the case main body 24. Furthermore, the insertion holes 44 are provided in the lid body 26 that covers the upper opening portion 22 in a tightly closed state, and thus, it is possible to expose the external connection portions 76 to the outside of the case 20 while keeping the inside of the case 20 waterproof. In addition, using the cover member 58 provided separately from the case 20, the insulative wall 62 can be easily provided between the pair of external connection portions 76, and the circumferences of the external connection portions 76 can be easily surrounded by the insulative wall 62. Therefore, it is also possible to easily realize insulation between the pair of external connection portions 76 and prevention of unnecessary contact between another member and the external connection portions 76, and the like.

Modified Examples

The first embodiment has been described above in detail as a specific example of the present disclosure, but the present disclosure is not limited to this specific description. Deformation, improvement, and the like in a range where a purpose of the present disclosure can be achieved are included in the present disclosure. The following modified examples of an embodiment of the present disclosure are also included in the technical scope of the present disclosure, for example.

(1) In the above embodiment, the relay terminals 66 are connected to the connection terminals 18 through screwing, but this connection may also be realized through fastening that uses another bolt and nut or a fastening member such as a bolt, welding, or the like.

(2) In addition, a relay that includes a precharge circuit has been illustrated and described as the circuit structure 12, but there is no limitation thereto. Various types of known circuit structures can be adopted as the circuit structure 12.

(3) Furthermore, an opening portion is provided on the upper side of the case 20, but a configuration may also be adopted in which an opening portion is provided on a lateral side of the case, and external connection portions protrude laterally.

(4) In addition, the shape of each relay terminal 66 is not limited to a cylindrical shape, and any shape such as a square pillar shape can also be adopted. Note that the insertion holes 44, the sealing members 72, and the like are shaped corresponding to the shape of the relay terminals 66.

LIST OF REFERENCE NUMERALS

10 Electrical junction box
12 Circuit structure
14 Relay unit
16 Input/output electrode
18 Connection terminal
19 Through hole
20 Case
22 Upper opening portion
24 Case main body
26 Lid body
28 Bottom wall
30 Peripheral wall
32 Fixing portion
34 Waterproof member
36 Relay unit mount
38 Connection terminal supporting portion
40 Elongated protrusion
42 Fixing portion
44 Insertion hole
46 Double wall
46A Inner wall
46B Outer wall
48 Annular groove
50 Engaging protrusion 52 Insulative wall portion
54 Partner terminal supporting portion
56 Guide wall
58 Cover member
60 Annular portion
62 Insulative wall
64 Engagement frame body
66 Relay terminal
68 Screw hole
70 Screw
72 Sealing member
76 External connection portion
78 Partner terminal
78A Insulative coating portion
78B Connection portion

The invention claimed is:

1. An electrical junction box comprising:
a circuit structure that includes a pair of connection terminals for connection to an external apparatus;
a case that includes a pair of insertion holes, and houses the circuit structure;
a pair of relay terminals that are respectively connected to the pair of connection terminals, and each include an external connection portion that is inserted into one of the insertion holes and is exposed to the outside of the case; and
a pair of sealing members that are each respectively compressed between opposing surfaces of one of the insertion holes and one of the relay terminals, and seals the insertion hole,
wherein circumferential wall portions of the insertion holes include annular grooves that are open upward in inner circumferential surfaces of the insertion holes, and house the sealing members,
the pair of relay terminals are respectively connected to the pair of connection terminals while the external connection portions of the pair of relay terminals are respectively inserted into the pair of insertion holes provided in the case, and are exposed to the outside of the case,
the case includes a cover member that includes a pair of annular portions that are attached to the circumferential wall portions of the pair of insertion holes and cover upper portions of the annular grooves while the external connection portions are respectively inserted into the annular portions and are exposed to the outside of the case, and
the cover member includes an insulative wall protruding between the pair of external connection portions, and surrounds circumferences of the external connection portions, the insulative wall coupling the pair of annular portions.

2. The electrical junction box according to claim 1, wherein the relay terminals have a cylindrical shape, and are inserted into the circular insertion holes, and the insertion holes are sealed as a result of the sealing members having a ring-like shape mounted on an outer circumferential surface of the relay terminals being tightly attached to inner circumferential surfaces of the insertion holes and the outer circumferential surfaces of the relay terminals.

3. The electrical junction box according to claim 2, wherein one end surface in an axial direction of each of the cylindrical relay terminals is exposed to the outside of the case, a screw hole for fastening a bolt is formed open at the center of the one end surface in the axial direction of each of the cylindrical relay terminals, a placement surface for a partner terminal is formed around the screw hole, and the one end surface in the axial direction forms the external connection portion.

4. The electrical junction box according to claim 1, wherein the case includes a box-like case main body that has an opening portion, and a lid body that covers the opening portion of the case main body in a tightly closed state, and the insertion holes are provided in the lid body.

* * * * *